United States Patent [19]

Funakoshi

[11] Patent Number: 4,954,772
[45] Date of Patent: Sep. 4, 1990

[54] TEST METHOD OF AN ELECTROSTATIC BREAKDOWN OF A SEMICONDUCTOR DEVICE AND AN APPARATUS THEREFOR

[75] Inventor: Haruo Funakoshi, Hyogo, Japan

[73] Assignee: Mitsubishi Denki Kabushiki Kaisha, Tokyo, Japan

[21] Appl. No.: 167,793

[22] Filed: Mar. 14, 1988

[30] Foreign Application Priority Data

Nov. 12, 1987 [JP] Japan .................................. 52-287985

[51] Int. Cl.$^5$ ............................................ G01R 31/26
[52] U.S. Cl. .............................. 324/158 R; 324/158 F; 324/454
[58] Field of Search ........... 324/158 R, 158 D, 158 T, 324/457, 458, 109, 454, 456, 158 F; 361/212, 225

[56] References Cited

U.S. PATENT DOCUMENTS 4,806,857  2/1989  Inamura et al. .................. 324/158 F

FOREIGN PATENT DOCUMENTS 5648550  9/1979  Japan .

OTHER PUBLICATIONS

ISTFA: "New ESD Test Method", by Y. Satoh et al., 1986, pp. 91–94.

Primary Examiner—Reinhard J. Eisenzopf
Assistant Examiner—Edward Urban
Attorney, Agent, or Firm—Lowe, Price, LeBlanc, Becker & Shur

[57] ABSTRACT

In a test method of an electrostatic breakdown of a semiconductor device in accordance with the present invention, a plurality of semiconductor devices are disposed at random on a member which has been electrostatically charged with a predetermined voltage, and the semiconductor devices are caused to be discharged while being moved on the member. Then, a test is performed to determine whether an electrostatic breakdown occurs in each of semiconductor devices. The electrical characteristics of each semiconductor device are measured after the charged static electricity has been removed. Each semiconductor device to be tested is incorporated in a package and has lead terminals connected to a semiconductor chip.

16 Claims, 5 Drawing Sheets

TEST METHOD OF AN ELECTROSTATIC BREAKDOWN OF A SEMICONDUCTOR DEVICE AND AN APPARATUS THEREFOR

BACKGROUND OF THE INVENTION

1. Field of the Invention

The present invention relates to a test of an electrostatic breakdown of a semiconductor device and, more particularly, to a test method of an electrostatic breakdown and an apparatus adapted for causing in a simulated manner an electrostatic breakdown of a semiconductor device in a real-use condition.

2. Description of the Prior Art

Static electricity is generally generated when different members are brought in contact with or removed away from each other while friction occurs therebetween. This static electricity affects a semiconductor device in various ways. The semiconductor device is affected by, for example, static electricity generated during transportation of the semiconductor device or static electricity existing in environments in which the semiconductor device is used. As a result, an electrostatic breakdown is caused in the semiconductor device with relative ease because of a fine structure thereof. More particularly, this trend becomes noticeable because of a low resistance of the electrostatic breakdown in a MOS (Metal Oxide Semicondcutor) type semiconductor integrated circuit device (hereinafter referred to as "MOSIC") due to a high input impedance and also because of a large-scale integration of MOSIC.

In MOSIC, this breakdown of an oxide film by the static electricity causes trouble because a thin gate oxide film is directly connected to input terminals. Therefore, in such a semiconductor device, this thin gate oxide film is protected using an input protection circuit. This input protection circuit serves to immediately absorb the static electricity so that a high voltage may not be applied on the thin gate oxide gate film. However, the input circuit could be broken down by the absorption current caused on that occasion. A typical example of the breakdown due to the static electricity in MOSIC is a breakdown of the thin gate oxide film in the input circuit.

As a test method of causing an electrostatic breakdown to occur in a real-use condition in a well simulated manner, a "new ESD(Electrostatic Discharge) test method" is disclosed by Y. Sato et al. of Mitsubishi Denki Kabushiki Kaisha in ISTFA(International Symposium for Testing and Failure Analysis) in 1986. FIG. 1 is a schematic perspective view showing one example of a tube vibration type testing apparatus employed in this test method of an electrostatic breakdown. This testing apparatus comprises a carriage case 22 made of plastic in which a plurality of semiconductor devices 1 are placed, a carriage case supporting material 23 on which the carriage case 22 is mounted, and a vibrating apparatus 24 for vibrating the carriage case supporting material 23. As shown in FIG. 2, each semiconductor device 1 comprises a semiconductor chip 101, lead terminals 102 connected to the semiconductor chip 101, and packages 103a and 103b for protecting and securing them.

Operation of this tube vibration type testing apparatus is described. First, the plurality of semiconductor devices 1 are inserted in a row into the carriage case 22 which is a plastic tube having a U-shape cross section. The carriage case 22 in which the semiconductor devices 1 are contained is fixed to the supporting material 23. Thereafter, a vibrating axis 24a is turned in directions shown by arrows D and E within a predetermined angular range by the vibrating device 24. As a result, the supporting material 23 is vibrated in directions shown by arrows F and G. At the same time, the plurality of semiconductor devices 1 in the carriage case 22 are moved in frictional manner on an inner face 22a of the carriage case 22 while their adjacent end faces collide with each other. Static electricity is generated by this friction. This static electricity is discharged from the lead terminals 102 of the semiconductor device 1 to the semiconductor chip 101. Then, the thin gate oxide film in the input circuit of each semiconductor device is broken down. In this way, a phenomenon of the electrostatic breakdown in a real-use condition can be caused to occur in a simulated manner. The vibration is carried out by a predetermined number of times dependent on the amount of the static electricity. Therefore, the resistance to the electrostatic breakdown in the real-use condition can be relatively evaluated by the number of vibrations. Each semiconductor device 1 is taken out from the carriage case 22 after having been vibrated by the predetermined number of times. Then, various electrical characteristics are measured in a test for each lead terminal by a tester to determined whether the electrostatic breakdown has occurred. This test is generally employed as a breakdown test conducted in development of new semiconductor devices or a sampling test in mass production.

In the conventional test method, the semiconductor devices, which are inserted into the carriage case in a row as described above, collide with each other by means of vibration to discharge static electricity. Thus, the static electricity is discharged only at the lead terminals 102a, 102b, 102c and 102d of the end portions of each semiconductor device 1 shown in FIG. 2. As a result, the resistance to the electrostatic breakdown can be evaluated only on the lead terminals of the end portions.

Furthermore, in the semiconductor devices inserted into the carriage case and vibrated, a breakdown phenomenon by the static electricity generated during transportation is only simulated.

SUMMARY OF THE INVENTION

The present invention was made to solve the above described problems. Therefore, it is an object of the present invention to provide a test method of an electrostatic breakdown of a semiconductor device and an apparatus for causing the static electricity to be discharged uniformly at every lead terminal from the standpoint of the statistical probability.

In the test method of an electrostatic breakdown of a semiconductor device in accordance with the present invention, a plurality of semiconductor devices are placed at random on a member which is electrostatically charged at a predetermined voltage, and then the semiconductor devices are moved on the member, to discharge static electricity as a result of mutual contact of lead terminals of the different ones of the plurality of semiconductor devices. Thereafter, the static electricity in the semiconductor devices is removed.

An apparatus for testing for an electrostatic breakdown of a semiconductor device in accordance with the present invention comprises charging means for electrostatically charging a member, semiconductor device holding means for placing semiconductor devices at random on the member and holding the same, and semiconductor device moving means for moving the semiconductor devices on a main surface of the member.

In a preferred embodiment of the present invention, the apparatus comprises a cylindrical body carrying an insulating material, rotating means for rotating this cylindrical body, and an insulating plate for generating a static electricity by causing friction on a surface of the insulating material in the cylindrical body. The semiconductor devices are disposed at random in the cylindrical body having a partition. The insulating plate is fixed and the cylindrical body carrying the insulating material is rotated, whereby the semiconductor devices are moved relatively to the surface of the insulating material while being pushed by the insulating plate.

According to the test method and the apparatus of the present invention, the plurality of semiconductor devices are placed at random on the member which is charged electrostatically with a predetermined voltage. Friction between the semiconductor devices and other members is not used in order to generate the static electricity. The semiconductor devices disposed at random are moved on the member which has been already charged, with the result that the static electricity is discharged by mutual contact of the lead terminals of the different ones of the plurality of semiconductor devices. Therefore, the static electricity can be discharged not only to the lead terminals on the end portions but also to the other lead terminals. Furthermore, the static electricity which has been charged are removed from the semiconductor devices, so that measurement of the electrical characteristics of the semiconductor devices is not adversely affected thereafter.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
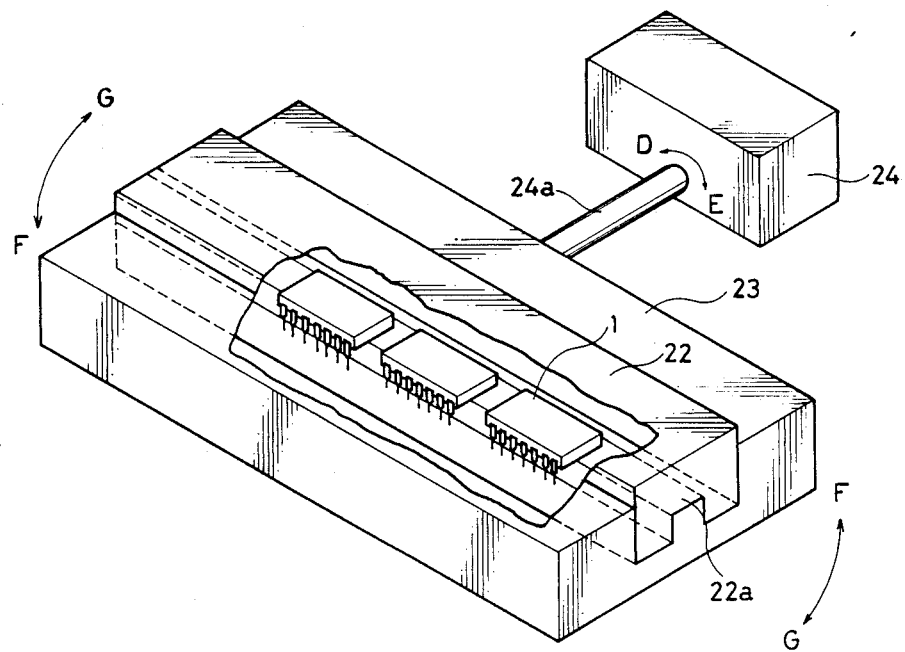
FIG. 1 is a perspective view showing a conventional test method of an electrostatic breakdown of a semiconductor device.
Figure 2:
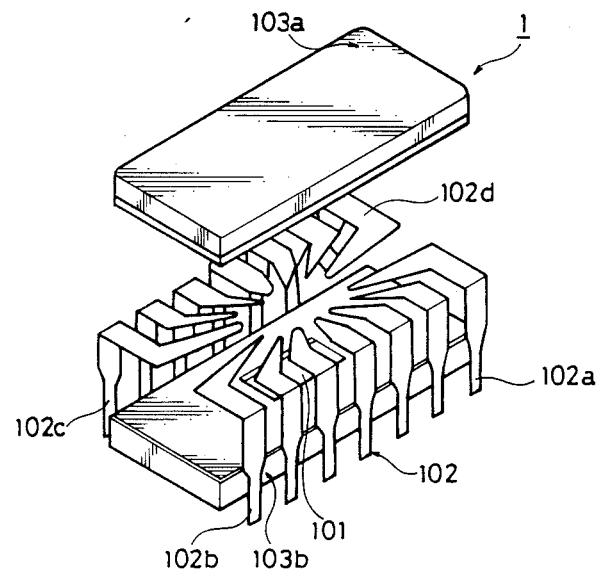
FIG. 2 is an exploded perspective view showing a semiconductor device.
Figure 3:
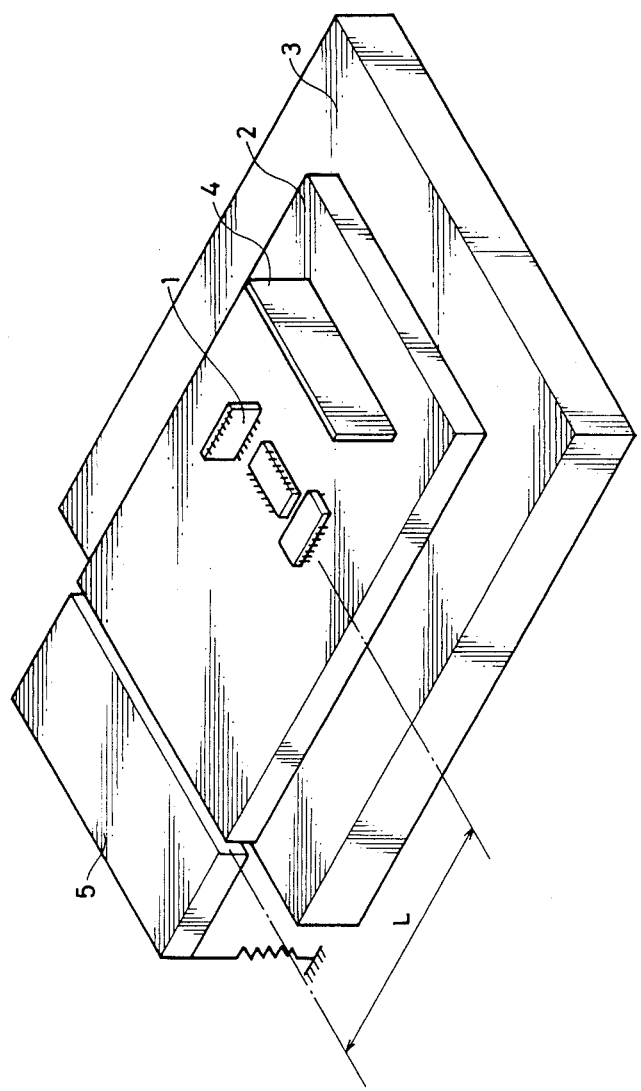
FIG. 3 is a perspective view for theoretically explaining one embodiment of a test method of an electrostatic breakdown of a semiconductor device in accordance with the present invention.

FIG. 3 is a perspective view for theoretically explaining one embodiment of a test method of an electrostatic breakdown of a semiconductor device in accordance with the present invention.

Semiconductor devices 1 are placed at random on a surface of an insulating material 2. The insulating material 2 is supported by a supporting body 3 of the insulating material. A conductive rubber 5 is grounded without contacting the insulating material 2. The test method is applied as follows.

First, the insulating material 2 is electrostatically charged by erecting an insulating plate 4 on the surface of the insulating material 2 as shown in the figure and making a frictional movement of the insulating plate 4. This charging is continued while measuring a voltage of the insulating material 2 until it attains a predetermined voltage of approximately 10 kV. The insulating material 2 and the insulating plate 4 may be of silicon rubber, bakelite, celluloid, acrylic and the like. In place of the insulating plate 4, a metal plate insulated to prevent emission of static electricity from the surfaces not contacting the insulating material 2 may be used. In other words, at least the insulating material 2 has only to be electrostatically charged. Instead of generating the static electricity by using the insulating plate 4, a conductive material which has been charged with the predetermined voltage may be used in place of the insulating material 2.

Then, the plurality of semiconductor devices 1 are placed at random in various directions on the electrostatically charged insulating material 2 as shown in the figure. Thereafter, the semiconductor devices 1 are moved while being pushed by the insulating plate 4. On this occasion, the semiconductor devices 1 are moved by a predetermined distance L. In this way, the static electricity which has been charged in the insulating material 2 is charged to the semiconductor devices 1. At the same time, the static electricity can be discharged to all lead terminals of the semiconductor devices 1 during the movement by mutual contact of the lead terminals of the different ones of the plurality of semiconductor devices, because the semiconductor devices 1 are placed in various orientations on the insulating material 2. This static electricity is discharged from the lead terminals of the semiconductor devices 1 to the semiconductor chip. Then, the thin gate oxide film in the input circuit may be broken down.

Thereafter, the charged static electricity is removed by putting the semiconductor devices 1 on the conductive rubber 5. Therefore, the measurement of the electric characteristics of the semiconductor devices by a tester is not affected by the static electricity. Each of the semiconductor devices is tested in a conventional manner by the tester with regard to every lead terminal thereof to determine whether the electrostatic breakdown has occurred.

Although in the above embodiment, the test method in which the insulating material 2 having a planar main surface is employed as a member being electrostatically charged is shown, a cylindrical insulating material, the main surface of which is a curved internal circumferential surface, may be used.

Figure 4:
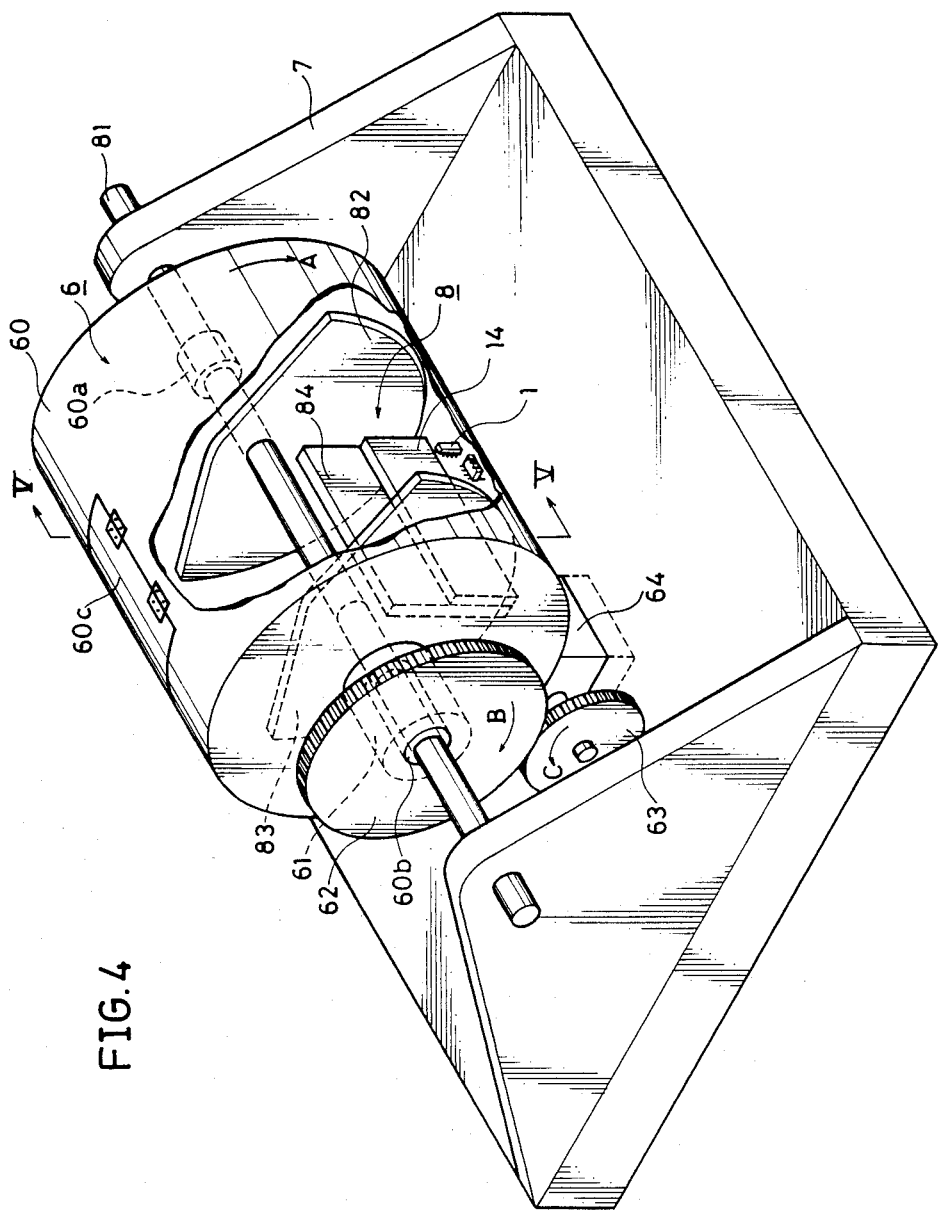
FIG. 4 is a perspective view showing one embodiment of an apparatus for testing for an electrostatic breakdown of a semiconductor device in accordance with the present invention.

Referring to the figures, an apparatus for testing for an electrostatic breakdown of a semiconductor device in accordance with the present invention is described. FIG. 4 is a perspective view showing one embodiment of the apparatus.

Referring to FIG. 4, this apparatus comprises a rotating portion 6 for pivotably supporting the insulating material, an insulating plate holder 8 holding the insulating plate 14, and a stand 7 supporting the insulating plate holder 8.

The rotating portion 6 has a drum 60 in which semiconductor devices 1 are contained. The drum 60 is fixed to a gear 62 through a connector 61. The gear 62 is provided so as to engaged with a gear 63. The gear 63 is driven by a motor 64. Semiconductor devices 1 are put in the drum 60 through an opening/closing plate 60c. The rotating portion 6 as a rotating body is slidable by means of bearings 60a and 60b along an axis 81.

An insulating plate holder 8 comprises the axis 81 penetrating through the drum 60, guide plates 82 and 83 mounted on the axis 81, and supporting plate 84 for the insulating plate, secured between the guide plates 82 and 83. The axis 81 is fixed by the stand. The semiconductor devices 1 contained in the drum 60 are disposed and carried between the guide plates 82 and 83 which are formed of an insulating material having a predetermined strength. The insulating plate 14 is mounted on the supporting plate 84.

Figure 5:
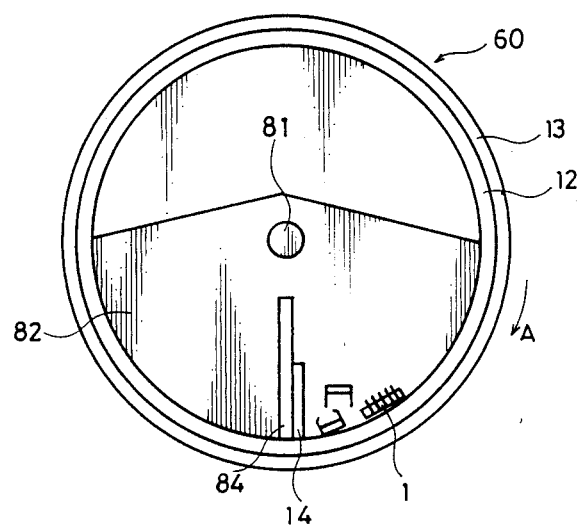
FIG. 5 is a sectional view taken along the line V—V shown in FIG. 4.

FIG. 5 is a sectional view taken along the line V—V shown in FIG. 4. The drum 60 comprises an insulating material 12 and a cylindrical supporting body 13 supporting the insulating material 12. The semiconductor devices 1 are placed at random in various orientations on a surface of the insulating material 12.

Now, operation of this testing apparatus is described. First, the drum 60 is rotated in a direction shown by an arrow A without putting the semiconductor devices 1 in the drum 60, when the gears 63 and 62 are rotated in directions shown by arrows C and B by the motor 64, respectively. At this time, friction is caused between the insulating plate 14 mounted on the supporting plate 84 for the insulating plate and the inner circumferential surface of the drum 60, that is, the insulating material 12, because the insulating plate holder 8 is fixed by the stand 7. Static electricity is generated on the surface of the insulating material 12 by this friction. The plurality of semiconductor devices 1 are put in the drum 60 through the opening/closing plate 60c when the insulating material 12 is electrostatically charged with the predetermined voltage. Then, the semiconductor devices 1 are placed between the guide plates 82 and 83 so that they may be disposed at random on the surface of the insulating material 12 which has been electrostatically charged. The semiconductor devices 1 are also disposed so as to be able to contact the surface of the insulating plate 14. Thereafter, the drum 60 is rotated again. At this time, the insulating plate 14 not only causes a friction with the insulating material 12 but also continues to push the semiconductor devices 1 so that the semiconductor devices 1 may move relatively on the surface of the insulating material 12. In this way, the static electricity in the insulating material 12 is charged to the semiconductor devices 1. In this case, the static electricity can be discharged to all of the lead terminals of the semiconductor devices 1 as described above. After the charged static electricity has been removed, each of the semiconductor devices are tested on every lead terminal by the tester to determine whether the electrostatic breakdown has occurred, as described above.

The present invention is not limited to the MOSIC and can be applied to various semiconductor devices.

As described above, in accordance with the present invention, since the static electricity can be discharged to each of the lead terminals, the electrostatic breakdown generated in a real-use condition can be well simulated and it becomes possible to evaluate the resistance to the electrostatic breakdown on all of the lead terminals.

Although the present invention has been described and illustrate in detail it is clearly understood that the same us by way of illustration and example only and is not to be taken by way of limitation, the spirit and scope of the present invention being limited only by the terms of the appended claims.

What is claimed is:

1. For a method of testing an electrostatic breakdown of a semiconductor device being incorporated in a package and having lead terminals mounted on said package in an aligned orientation and connected to a semiconductor chip in said semiconductor device, by electrostatically discharging said semiconductor deice in said package to perform a test to determine whether an electrostatic breakdown is caused in said semiconductor device, a method of charging and discharging said device, comprising the steps of:
   disposing a plurality of said semiconductor devices such that said aligned orientations thereof form random angles with respect to each other on a main surface of a member electrostatically charged with a predetermined voltage;
   moving said semiconductor devices on the main surface of said member and mutually contacting said lead terminals of different ones of said semiconductor devices to causes discharge to said semiconductor devices; and
   removing the static electricity which has been charged in said semiconductor devices.

2. A method in accordance with claim 1, wherein said member comprises an insulating material.

3. For a method of testing an electrostatic breakdown of a semiconductor device being incorporated in a package and having lead terminals mounted on said package and connected to a semiconductor chip in said semiconductor device, by electrostatically discharging said semiconductor device in said package to perform a test to determine whether an electrostatic breakdown is caused in said semiconductor device, a method of charging and discharging said device, comprising the steps of:
   disposing a plurality of said semiconductor devices at random on a main surface of a member electrostatically charged with a predetermined voltage, said member comprising an insulating material;
   moving said semiconductor devices on the main surface of said member and mutually contacting said lead terminals of different ones of said semiconductor devices to cause discharge to said semiconductor devices;
   removing the static electricity which has been charged in said semiconductor devices; and
   electrostatically charging said insulating material by moving an insulating plate in a frictional manner on a main surface of said insulating material.

4. A method in accordance with claim 3, wherein said step of moving said semiconductor devices on the main surface of said member comprises the step of causing said insulating plate to move said semiconductor devices while pushing on the main surface of said insulating material.

5. A method in accordance with claim 4, wherein said main surface of said insulating material comprises a cylindrical internal surface.

6. A method in accordance with claim 1, wherein said step of removing the static electricity which has been charged in said semiconductor devices comprise the step of disposing said semiconductor devices on a conductor which is grounded.

7. An apparatus for use in testing an electrostatic breakdown of a semiconductor device being incorporated in a package and having lead terminals in an aligned orientation connected to a semiconductor chip in said semiconductor device, by electrostatically discharging said semiconductor device in said package to perform a test to determine whether an electrostatic breakdown is caused in said semiconductor device, comprising:

charging means for electrostatically charging a main surface of a member;

supporting means for supporting said member;

semiconductor device holding means for disposing a plurality of said semiconductor devices such that said aligned orientations thereof form random angles with respect to each other on the main surface of said member and holding the same; and semiconductor device moving means for moving said semiconductor devices on the main surface of said member and mutually contacting said lead terminals of different ones of said semiconductor devices to cause discharge to said semiconductor devices.

8. An apparatus in accordance with claim 7, wherein said members comprises an insulating material.

9. An apparatus for use in testing an electrostatic breakdown of a semiconductor device being incorporated in a package and having lead terminals connected to a semiconductor chip in said semiconductor device, by electrostatically discharging said semiconductor device in said package to perform a test to determine whether an electrostatic breakdown is caused in said semiconductor device, comprising:

charging means for electrostatically charging a main surface of a member, said member comprising an insulating material;

supporting means for supporting said member;

semiconductor device holding means for disposing a plurality of said semiconductor devices at random on the main surface of said member and holding the same; and semiconductor device moving means for moving said semiconductor devices on the main surface of said member and mutually contacting said lead terminals of different ones of said semiconductor devices to cause discharge to said semiconductor devices;

wherein said charging means comprises means for moving an insulating plate in a frictional manner on the main surface of said insulating material.

10. An apparatus in accordance with claim 9, wherein said semiconductor device moving means comprises means for enabling said insulating plate to move said semiconductor devices on the main surface of said insulator by pushing.

11. An apparatus in accordance with claim 10, wherein said charging means and said semiconductor moving means fix said insulating plate and move said insulating material relatively to, said insulating plate.

12. An apparatus in accordance with claim 11, wherein said supporting means comprises a cylindrical body.

13. An apparatus in accordance with claim 12, wherein said charging means and said semiconductor device moving means comprise rotating means for rotating said cylindrical body.

14. An apparatus in accordance with claim 13, wherein said semiconductor device holding means has a partition in said cylindrical body.

15. A testing apparatus in accordance with claim 14, wherein said rotating means comprises a motor and a gear.

16. An apparatus in accordance with claim 15, wherein said insulating plate is secured by an axis penetrating through said cylindrical body and a stand supporting the axis.

* * * * *